(12) United States Patent
Huang et al.

(10) Patent No.: US 7,393,217 B2
(45) Date of Patent: Jul. 1, 2008

(54) SURFACE MOUNT CONNECTOR AND CIRCUIT BOARD ASSEMBLY WITH SAME

(75) Inventors: Kai-Hung Huang, Taoyuan Hsien (TW); Chin-Chi Kuo, Taoyuan Hsien (TW); Tsen-En Li, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 11/006,067

(22) Filed: Dec. 7, 2004

(65) Prior Publication Data

US 2005/0221636 A1  Oct. 6, 2005

(30) Foreign Application Priority Data

Apr. 2, 2004  (TW) ............................. 93205094 U (51) Int. Cl.
H01R 12/00 (2006.01)
(52) U.S. Cl. ....................................................... 439/83

(58) Field of Classification Search ................. 439/120, 439/67, 74, 931, 876, 60, 751, 80–83, 571; 29/878, 509
See application file for complete search history.

(56) References Cited

U.S. PATENT DOCUMENTS

| | | | | |
|---|---|---|---|---|
| 5,046,243 A * | 9/1991 | Walker | ......................... | 29/878 |
| 5,082,460 A * | 1/1992 | Legrady | ..................... | 439/741 |
| 5,104,324 A * | 4/1992 | Grabbe et al. | ................. | 439/62 |
| 5,484,964 A * | 1/1996 | Dawson et al. | .............. | 174/261 |
| 5,641,291 A * | 6/1997 | Sueki et al. | .................... | 439/83 |
| 5,980,267 A * | 11/1999 | Ayers et al. | .................... | 439/60 |
| 6,095,857 A * | 8/2000 | Isac | ........................... | 439/571 |
| 6,392,899 B1* | 5/2002 | Harrison et al. | ............. | 361/803 |
| 6,619,965 B1* | 9/2003 | Kihira et al. | .................. | 439/74 |
| 6,623,283 B1* | 9/2003 | Torigian et al. | ............... | 439/83 |
| 6,660,946 B2* | 12/2003 | Saiki et al. | ................... | 174/267 |
| 6,875,032 B2* | 4/2005 | Tsuchiya | ..................... | 439/82 |

\* cited by examiner

Primary Examiner—Edwin A. León (57) ABSTRACT

A circuit board assembly includes a first circuit board, at least one surface mount connector, and a second circuit board. The first circuit board has at least a first contact. The surface mount connector is substantially a solid rod and includes a first conducting part coupled to the contact of the first circuit board and a second conducting part having a curvy raised portion at the top surface thereof. The second circuit board has at least a second contact coupled to the second conducting part of the surface mount connector.

12 Claims, 12 Drawing Sheets

SURFACE MOUNT CONNECTOR AND CIRCUIT BOARD ASSEMBLY WITH SAME

FIELD OF THE INVENTION

The present invention relates to a connector, and more particularly to a surface mount connector. The present invention also relates to a circuit board assembly with such a connector.

BACKGROUND OF THE INVENTION

A connector, for example a conductive pin, is widely used to electrically and/or structurally interconnect two circuit boards. Currently, by using a surface mount technology (SMT), the circuits or electronic components on two circuit boards are electrically connected with each other via this type of surface mount connector.

Figure 1:
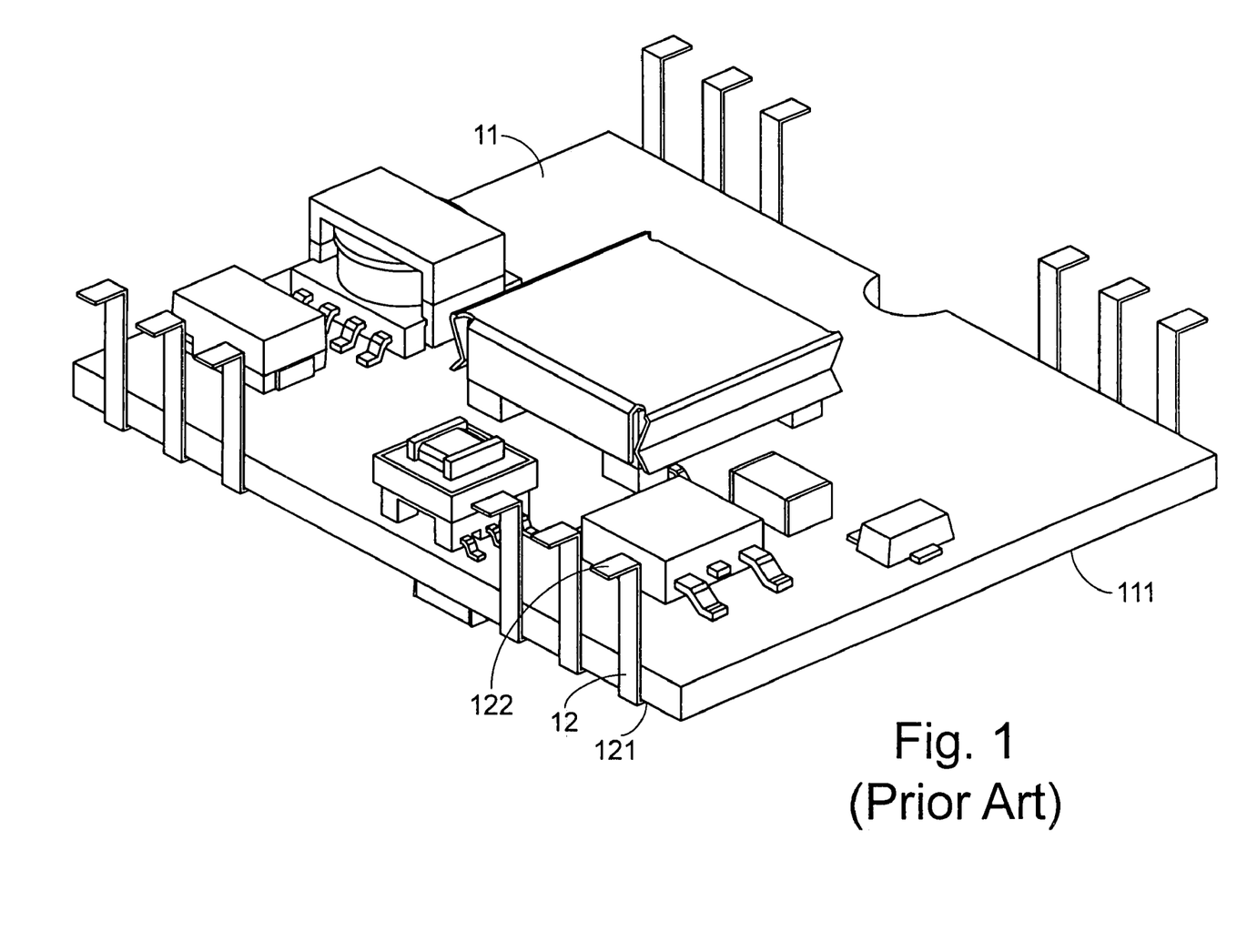
FIG. 1 is a perspective view schematically illustrating a surface mount connector disposed on a first circuit board.

Please refer to FIG. 1, which schematically illustrates a surface mount connector disposed on a first circuit board. As shown, several electronic components are disposed on the first circuit board 11. In addition, several surface mount connectors 12 are extended upwardly from the bottom surface 111 of the first circuit board 11. For a purpose of arranging each surface mount connector 12, the lower end 121 thereof is soldered onto the bottom surface 111 of the first circuit board 11. Then, the surface mount connector 12 adjacent to the soldering portion is bent upwardly and in contact with an edge of the first circuit board 11. Afterward, the upper end of the surface mount connector 12 is bent horizontally so as to form a protruding pin 122 in parallel with the first circuit board 11. As shown in FIG. 1, there are some surface mount connectors 12 extending from the edge of the first circuit board 11 in a row such that the protruding pins 122 of these surface mount connectors 12 are in parallel with of each other.

Figure 2:
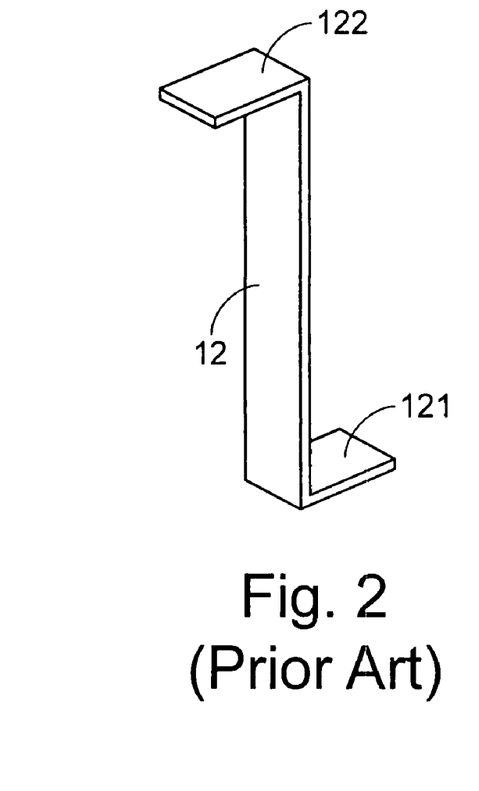
FIG. 2 is a perspective view illustrating one surface mount connector in FIG. 1.
Figure 3:
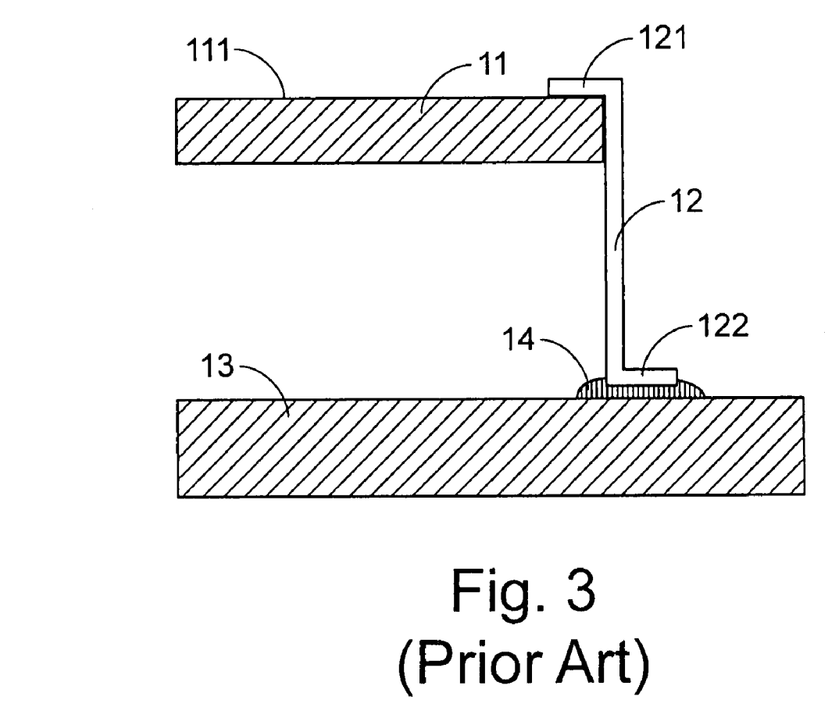
FIG. 3 is a cross-sectional view illustrating two circuit boards interconnected by the surface mount connector of FIG. 2.

Referring to FIG. 2, a perspective view of one surface mount connector in FIG. 1 is shown. The surface mount connector 12 is substantially in a form of a plate and made of metallic material. For a purpose of electrically and/or structurally connecting the first circuit board 11 with the second circuit board 13, a solder paste 14 is firstly applied to the contact on the second circuit board 13, as is shown in FIG. 3. Then, the protruding pin 122 of the surface mount connector 12 is aligned with the contact on the second circuit board 13. After the first circuit board 11 and the second circuit board 13 pass through a reflow furnace (not shown), the protruding pin 122 of the surface mount connector 12 is securely bonded to the contact on the second circuit board 13 so as to form the resulting structure of FIG. 3.

The structure of FIG. 3, however, has some drawbacks. For example, the surface mount connector 12 fails to withstand a large current because the surface mount connector 12 is formed from a bent metallic plate. On the other hand, since each protruding pin 122 of the surface mount connector 12 of the first circuit board 11 is in contact with the contact of second circuit board 13 before being soldered onto the second circuit board 13, each protruding pin 122 should have a substantially flat bottom surface. Although all protruding pins 122 of the surface mount connectors 12 extending from the edge of the first circuit board 11 in the same row have flat bottom surfaces, it is difficult to make the bottom surfaces of these protruding pins 122 coplanar. As such, some holes may be formed in the solder paste 14 and the adhesion property between the protruding pins 122 and the second circuit board 13 is not satisfied. Accordingly, impedance and power loss are increased. In addition, the process of forming each protruding pin 122 is complex and costly, because the surface mount connector 12 should be bent twice.

Figure 4:
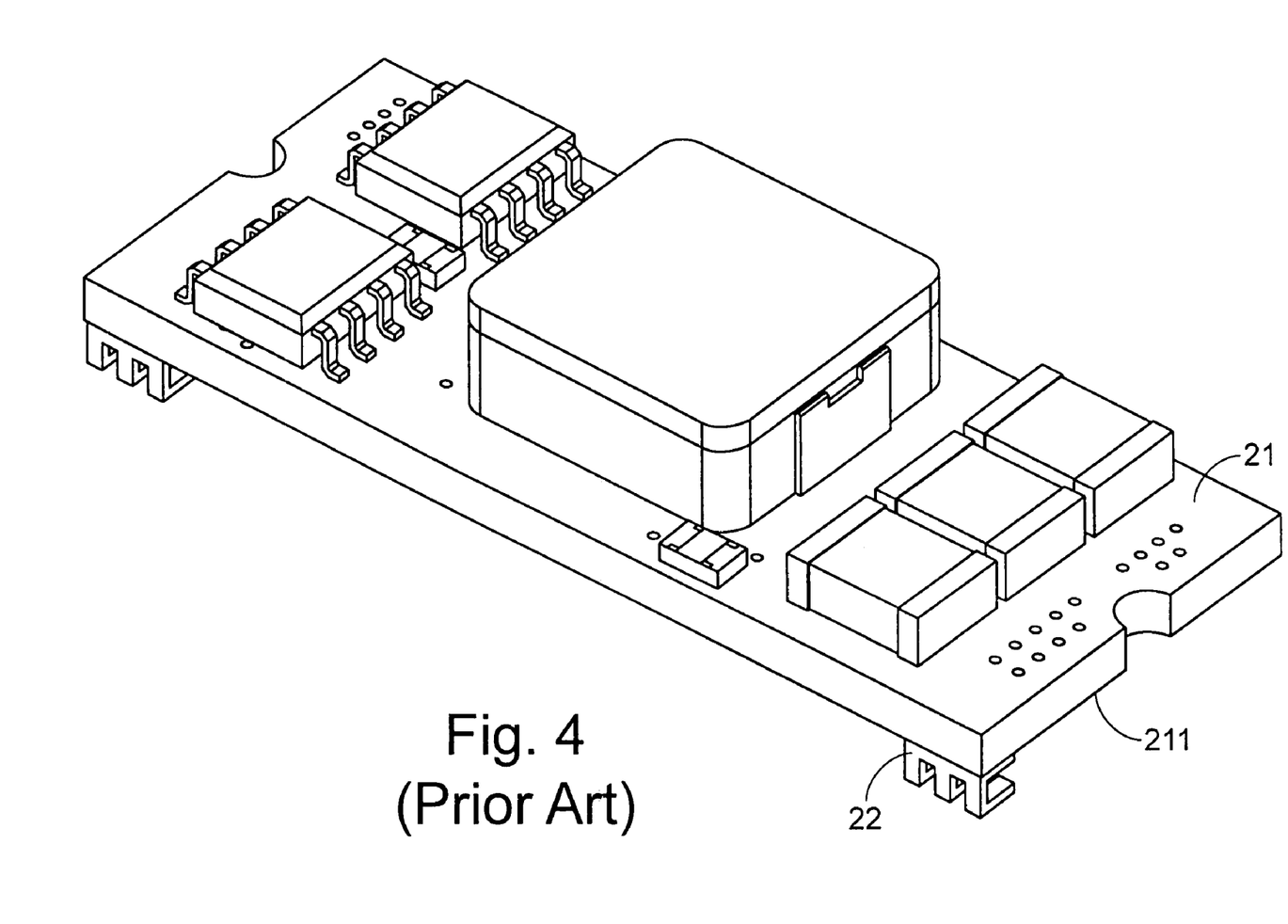
FIG. 4 is a perspective view schematically illustrating another surface mount connector disposed on a first circuit board.

Please refer to FIG. 4, which schematically illustrates another surface mount connector disposed on a first circuit board. As shown, several electronic components are disposed on the first circuit board 21. In addition, several surface mount connectors 22 are extended upwardly from the bottom surface 211 of the first circuit board 21. For a purpose of arranging each surface mount connector 22, the bottom surface thereof is soldered onto the bottom surface 211 of the first circuit board 21.

Figure 5:
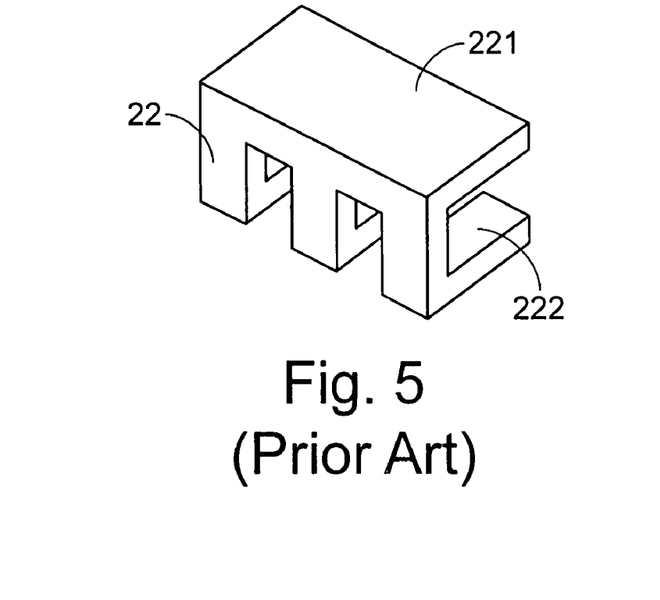
FIG. 5 is a perspective view illustrating one surface mount connector in FIG. 4.

Referring to FIG. 5, a perspective view of one surface mount connector in FIG. 4 is shown. The surface mount connector 22 has a base 221 and several bent pins 222 discretely arranged at a regular interval and extended from the base 221.

Figure 6:
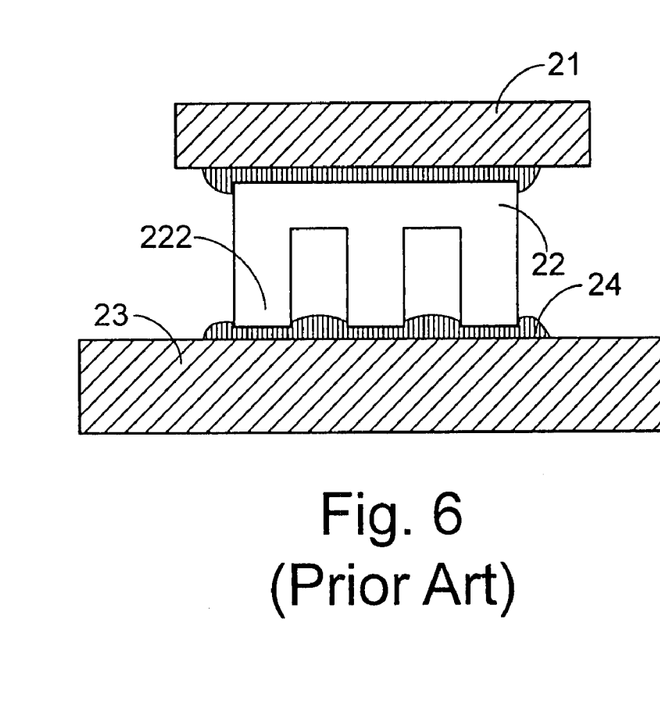
FIG. 6 is a cross-sectional view illustrating two circuit boards interconnected by the surface mount connector of FIG. 5.

For a purpose of electrically and/or structurally connecting the first circuit board 21 with a second circuit board 23, a solder paste 24 is firstly applied to the contact on the second circuit board 23, as shown is in FIG. 6. Then, the bent pins 222 of the surface mount connector 22 of the first circuit board 21 is aligned with the contact on the second circuit board 23. After the first circuit board 21 and the second circuit board 23 pass through a reflow furnace (not shown), the bent pins 222 of the surface mount connector 22 is securely bonded to the contact on the second circuit board 23 so as to form the resulting structure of FIG. 6.

The structure of FIG. 6, however, also has similar drawbacks as that of FIG. 3. For example, the surface mount connector 22 fails to withstand a large current because the surface mount connector 22 is formed from a bent metallic plate. On the other hand, since each bent pin 222 of the surface mount connector 22 of the first circuit board 21 is in contact with the contact of second circuit board 23 before being soldered onto the second circuit board 23, each bent pin 222 should have a substantially flat bottom surface. As such, some holes may be formed in the solder paste 24 and the adhesion between the protruding pins 222 and the second circuit board 23 is not satisfied. Accordingly, impedance and power loss are increased. In addition, the process of forming the surface mount connector 22 is more complex and costly, because a specified metallic plate should be firstly provided and then bent twice.

SUMMARY OF THE INVENTION

An object of the present invention is to provide a surface mount connector for electrically and/or structurally interconnecting two circuit boards, in which the surface mount connector is capable of withstanding more current and the holes formed during the soldering process is minimized so as to reduce impedance and power loss when operated.

Another object of the present invention is to provide a circuit board assembly with such a connector so as to enhance the yield and reliability.

In accordance with a first aspect of the present invention, there is provided a circuit board assembly. The circuit board assembly comprises a first circuit board, at least one surface mount connector, and a second circuit board. The first circuit board has at least a first contact. The surface mount connector is substantially a solid rod and comprises a first conducting part coupled to the first contact of the first circuit board and a second conducting part having a curvy raised portion at the top surface thereof. The second circuit board has at least a second contact coupled to the second conducting part of the surface mount connector.

In an embodiment, the cross section of the surface mount connector is in a circular or polygonal shape.

In an embodiment, the first contact is a conducting cavity, and the first conducting part is inserted into the conducting cavity.

In an embodiment, the diameter of the first conducting part is less than that of the second conducting part.

In an embodiment, the second conducting part comprises a first sub-part coupled to the first conducting part and a second sub-part coupled to the second circuit board. Preferably, the diameter of the first sub-part is larger than that of the first conducting part.

In an embodiment, the cross section of the surface mount connector is in a rectangular shape.

In an embodiment, the first conducting part and the second conducting part are disposed at opposite sides of the surface mount connector.

In an embodiment, the first conducting part has a wavy, flat or curvy surface, and the second conducting part has a curvy surface. Alternatively, each of the first and second conducting parts has a wavy, flat or curvy surface.

Preferably, the circuit board assembly is a DC-to-DC converter. The first and second circuit boards have thereon a controlling portion and a power supply portion of the DC-to-DC converter, respectively.

In accordance with a second aspect of the present invention, there is provided a surface mount connector for electrically and/or structurally interconnecting first and second circuit boards. The surface mount connector is substantially a solid rod and comprises a first conducting part and a second conducting part. The first conducting part is coupled to the first circuit board. The second conducting part has a curvy raised portion at the top surface thereof and is coupled to the second circuit board.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 7A:
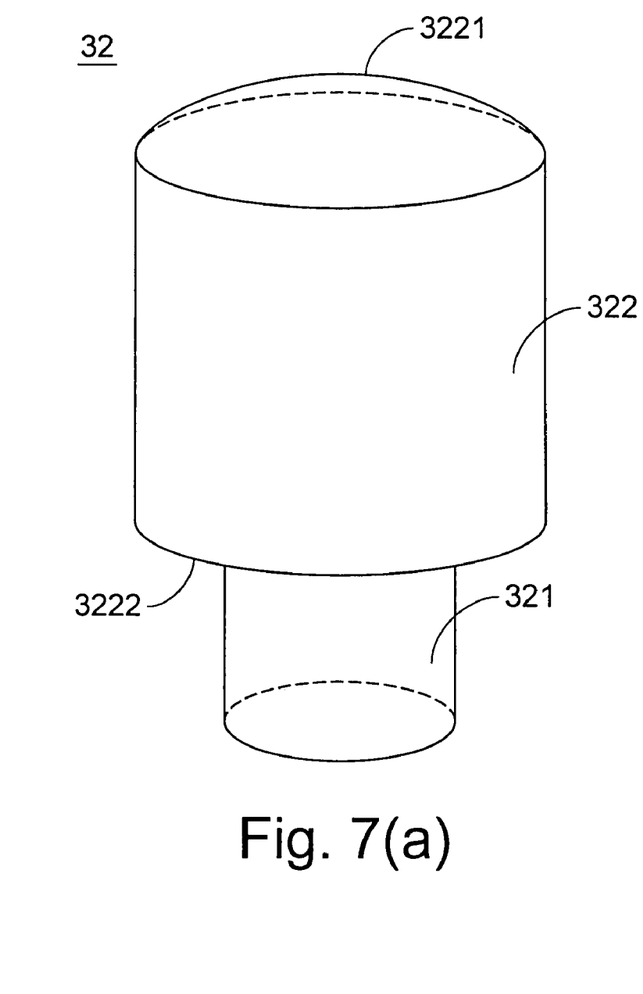
FIG. 7(a) is a perspective view schematically illustrating a surface mount connector according to a preferred embodiment of the present invention.

Referring to FIG. 7(a), a surface mount connector according to a preferred embodiment of the present invention is shown. The surface mount connector 32 of FIG. 7(a) is used for electrically and/or structurally interconnecting two circuit boards, and comprises a first conducting part 321 and a second conducting part 322. Each of the first conducting part 321 and the second conducting part 322 is a solid rod made of metallic material, and the cross section thereof is in a circular or polygonal shape. In this embodiment, the diameter of the first conducting part 321 is less than that of the second conducting part 322. Moreover, the second conducting part 322 has a curvy raised portion 3221 at the top surface thereof.

Figure 8:
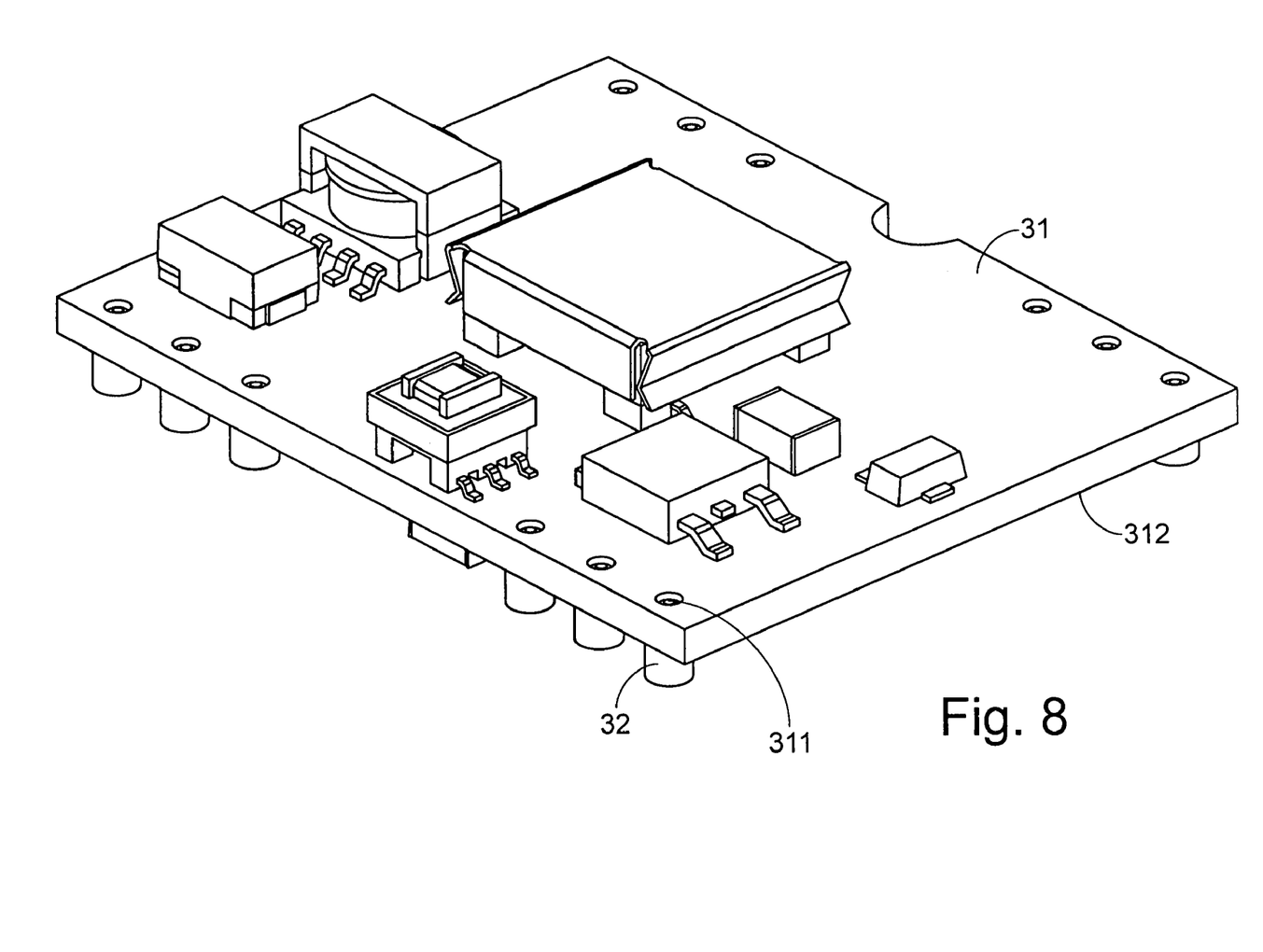
FIG. 8 illustrates a first circuit board mounted thereon several surface mount connectors of FIG. 7(a)

Referring to FIG. 8, a first circuit board 31 mounted thereon several surface mount connectors 32 of FIG. 7(a) is shown. The first circuit board 31 comprises thereon several electronic components and several contacts such as conducting cavities 311. Via these conducting cavities 311, the surface mount connectors 32 can be bonded to the bottom surface 312 of the first circuit board 31. For example, for a purpose of arranging each surface mount connector 32, a solder paste (not shown) is firstly applied to the inner wall of the respective conducting cavity 311. Then, the first conducting part 321 of the surface mount connector 32 is inserted into the respective conducting cavity 311. After the first circuit board 31 and the surface mount connector 32 pass through a reflow furnace (not shown), the first conducting part 321 of the surface mount connector 22 is bonded to the inner wall of the conducting cavity 311.

Figure 9:
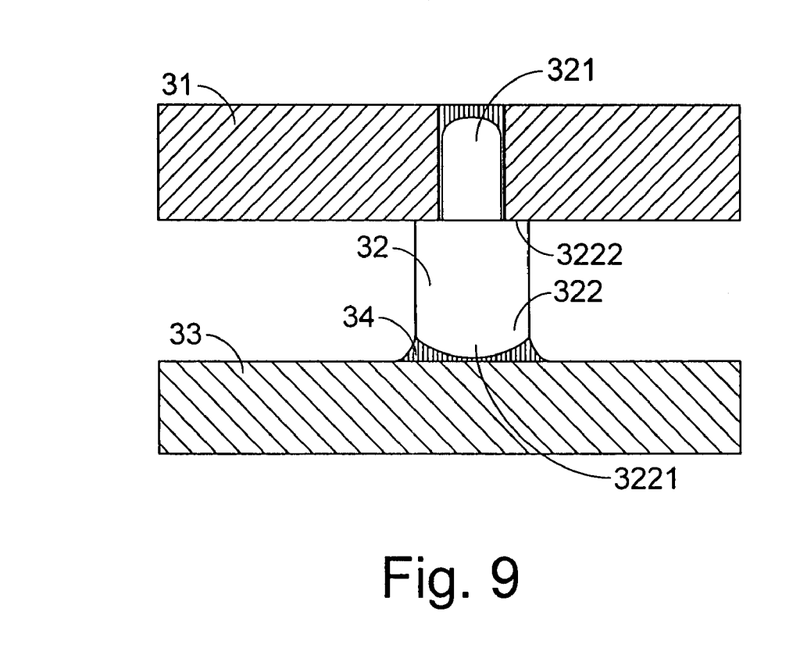
FIG. 9 is a cross-sectional view illustrating two circuit boards interconnected by the surface mount connector of FIG. 7(a)

As shown in FIG. 9, when the first conducting part 321 of the surface mount connector 32 is inserted into the respective conducting cavity 311, a ring-shaped shoulder portion 3222 is formed at the interface between the first conducting part 321 and the second conducting part 322. Since the diameter of the first conducting part 321 is less than that of the second conducting part 322, the outer periphery of the conducting cavity 311 will be supported by the ring-shaped shoulder portion 3222, and thus the surface mount connector 32 is firmly bonded on the first circuit board 31. Then, a solder paste 34 is applied to the contact on the second circuit board 33. After the first circuit board 31 and the second circuit board 33 pass through a reflow furnace (not shown), the solder paste 34 will be naturally filled in a gap between the curvy raised portion 3221 at the top surface of the second conducting part 322 and the contact on the second circuit board 33 due to a siphonal effect resulted from the tension force of the molten solder paste 34. In other words, the curvy raised portion 3221 at the top surface of the second conducting part 322 is advantageous for minimizing formation of holes during the soldering period, and thus the second conducting part 322 of the surface mount connector 32 is firmly bonded on the second circuit board 32.

Figure 7B:
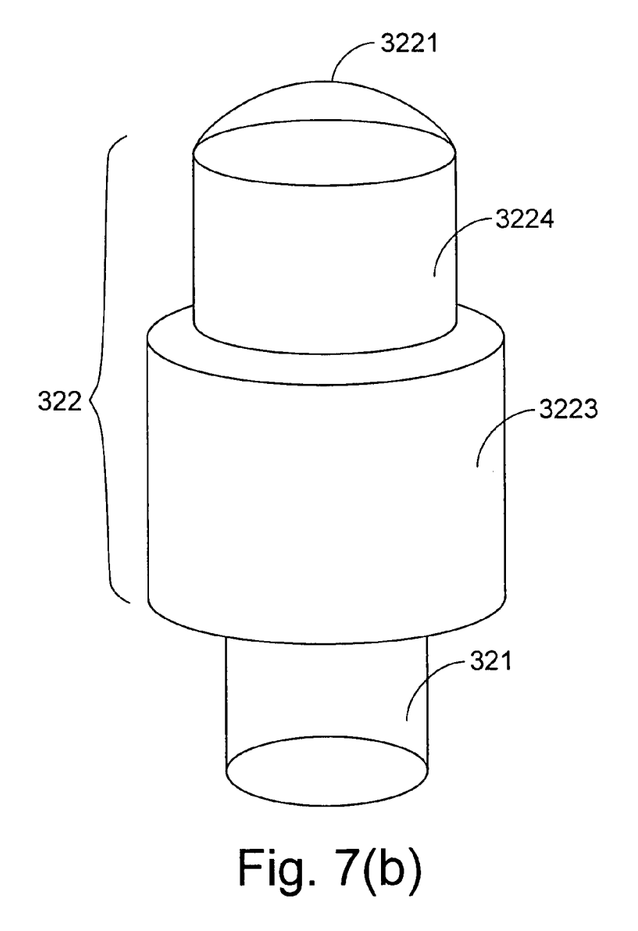
FIG. 7(b) is a perspective view schematically illustrating a surface mount connector according to another preferred embodiment of the present invention.

Referring to FIG. 7(b), a further embodiment of a surface mount connector is shown. The structure of this surface mount connector is similar to that FIG. 7(a), except that the second conducting part 322 comprises at least two sub-parts, for example a first sub-part 3223 and a second sub-part 3224. The first sub-part 3223 is adjacent to the first conducting part 321. The second sub-part 3224 has a curvy raised portion 3221 at the top surface thereof to be soldered onto the second circuit board 33. The diameter of the first sub-part 3223 is larger than that of the first conducting part 321. The principle of electrically and/or structurally interconnecting the first circuit board 31 and the second circuit board 33 via the surface mount connector 32 is identical to that illustrated in FIG. 9, and is need to be redundantly described herein.

Figure 10:
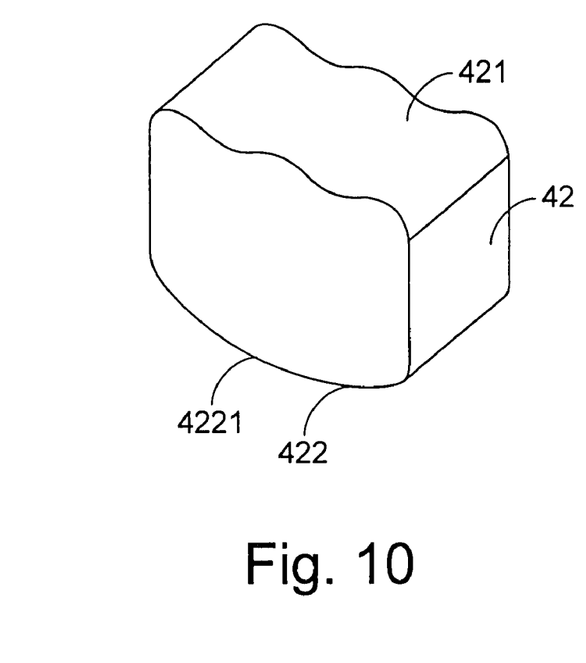
FIG. 10 is a perspective view schematically illustrating a surface mount connector according to another preferred embodiment of the present invention.

Referring to FIG. 10, a further embodiment of a surface mount connector is shown. The surface mount connector 42 of FIG. 10 is used for electrically and/or structurally interconnecting two circuit boards. The surface mount connector 42 is made of metallic material, and the cross section thereof is substantially rectangular. The surface mount connector 42 comprises a first conducting part 421 and a second conducting part 422, which are disposed at opposite sides of the surface mount connector 42. The first conducting part 421 has a wavy, flat or curvy surface. The second conducting part 422 has a curvy surface 4221 at the top surface thereof.

Figure 11:
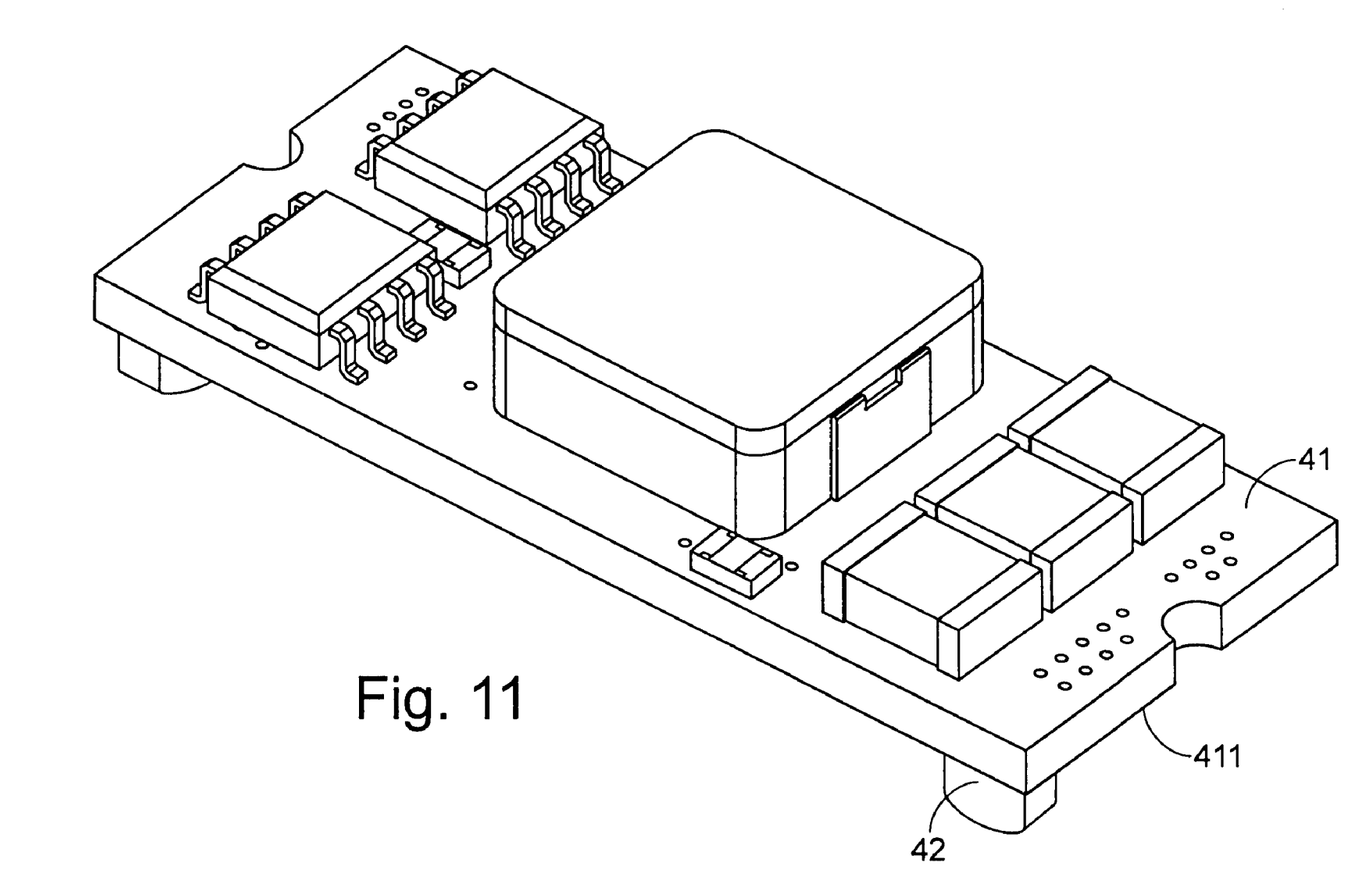
FIG. 11 illustrates a first circuit board mounted thereon several surface mount connectors of FIG. 10.

As shown in FIG. 11, a first circuit board 41 having mounted thereon several surface mount connectors 42 of FIG. 10 is shown. The first circuit board 41 comprises thereon several electronic components and several contacts (not shown). Via these contacts, the surface mount connectors 42 can be bonded to the bottom surface 411 of the first circuit board 41. For example, for a purpose of arranging each surface mount connector 42, a solder paste (not shown) is firstly applied to the respective contact. Then, the first conducting part 421 of the surface mount connector 42 is aligned with the contact on the first circuit board 41. After the first circuit board 41 and the surface mount connector 42 pass through a reflow furnace (not shown), the first conducting part 421 of the surface mount connector 42 is bonded to the contact of the first circuit board 41.

Figure 12:
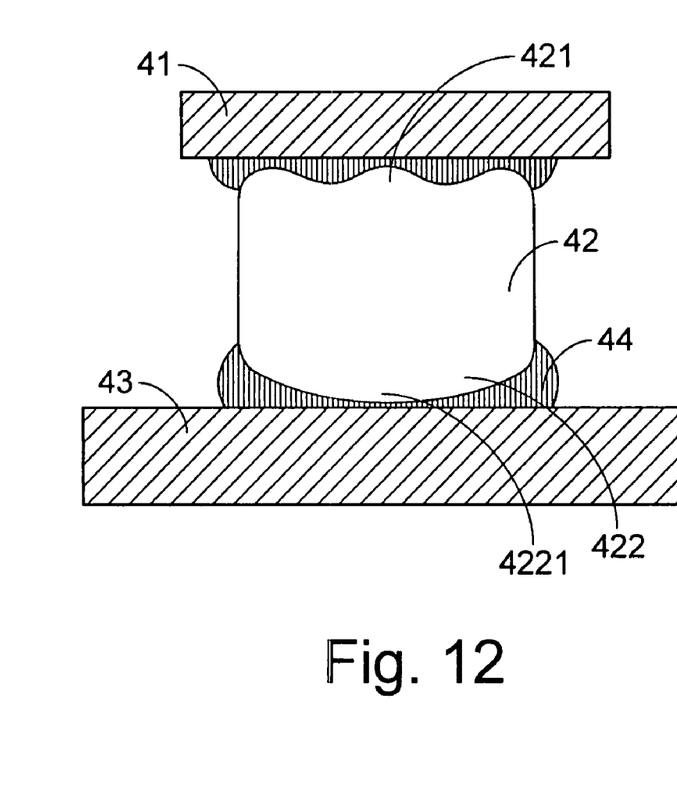
FIG. 12 is cross-sectional view illustrating two circuit boards interconnected by the surface mount connector of FIG. 10.

Then, as shown in FIG. 12, a solder paste 44 is applied to the contact on the second circuit board 43. After the first circuit board 41 and the second circuit board 43 pass through a reflow furnace (not shown), the solder paste 44 will be naturally filled in a gap between the curvy raised portion 4221 at the top surface of the second conducting part 422 and the contact on the second circuit board 43 due to a siphonal effect resulted from the tension force of the molten solder paste 44. In other words, the curvy raised portion 4221 at the top surface of the second conducting part 422 is advantageous for minimizing formation of holes during the soldering period, and thus the second conducting part 422 of the surface mount connector 42 is firmly bonded on the second circuit board 42.

Figure 13:
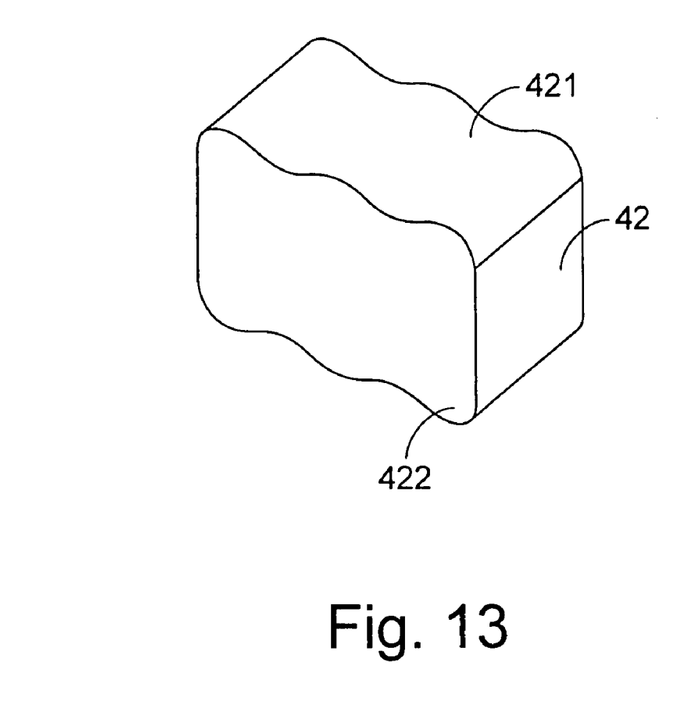
FIG. 13 is a perspective view schematically illustrating a surface mount connector according to another preferred embodiment of the present invention.

Referring to FIG. 13, a further embodiment of a surface mount connector is shown. The surface mount connector 42 of FIG. 13 is used for electrically and/or structurally interconnecting two circuit boards. The surface mount connector 42 is made of metallic material, and the cross section thereof is substantially rectangular. The surface mount connector 42 comprises a first conducting part 421 and a second conducting part 422, which are opposed to each other. In this embodiment, the first conducting part 421 and the second conducting part 422 have identical structures, for example each of which has a wavy, flat or curvy surface.

Figure 14:
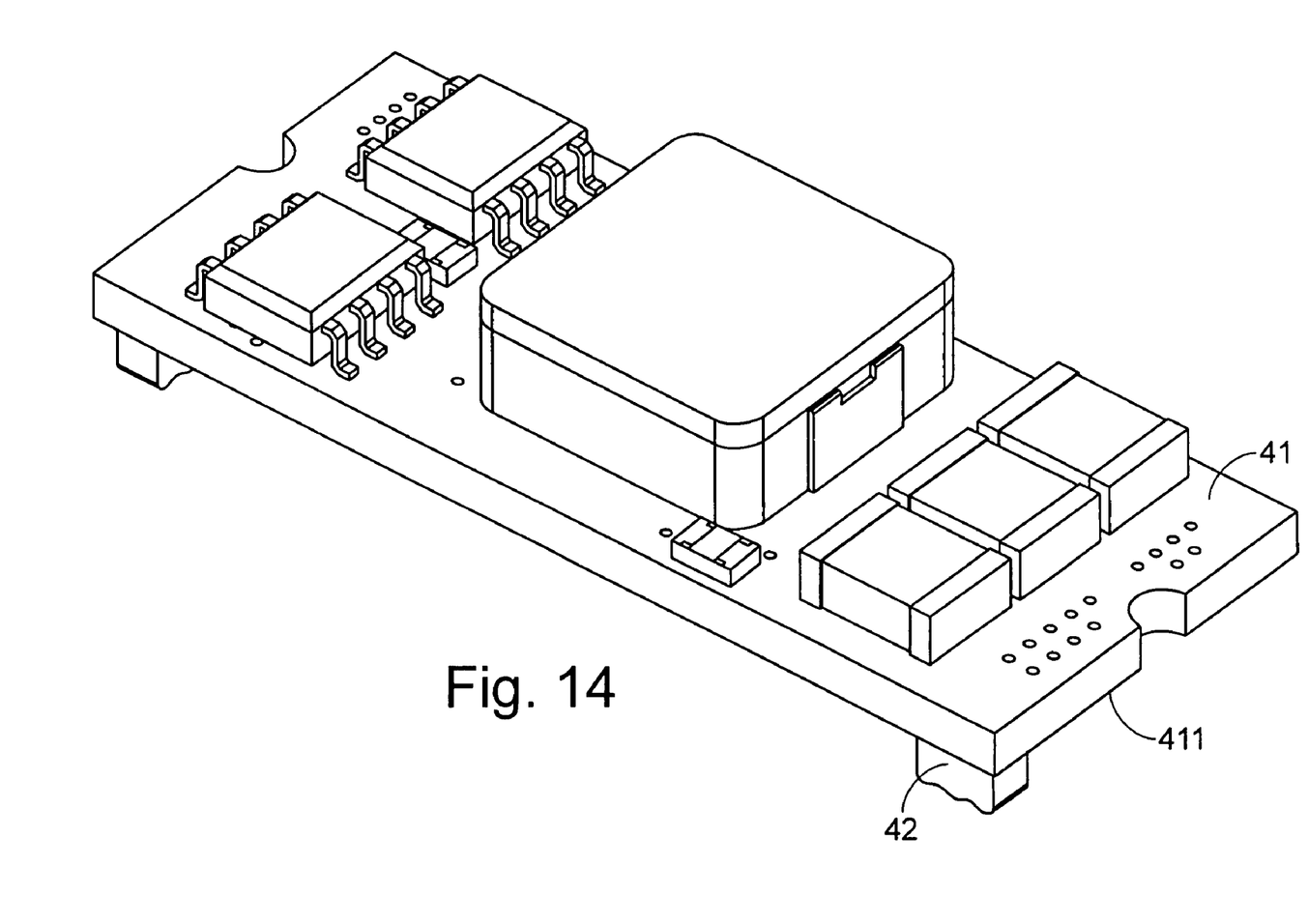
FIG. 14 illustrates a first circuit board mounted thereon several surface mount connectors of FIG. 13.

As shown in FIG. 14, a first circuit board 41 mounted thereon several surface mount connectors 42 of FIG. 13 is shown. The first circuit board 41 comprises thereon several electronic components and several contacts (not shown). Via these contacts, the surface mount connectors 42 can be bonded to the bottom surface 411 of the first circuit board 41. For example, for a purpose of arranging each surface mount connector 42, a solder paste (not shown) is firstly applied to the respective contact. Then, the first conducting part 421 of the surface mount connector 42 is aligned with the contact on the first circuit board 41. After the first circuit board 41 and the surface mount connector 42 pass through a reflow furnace (not shown), the first conducting part 421 of the surface mount connector 42 is bonded to the contact of the first conducting part 421.

Figure 15:
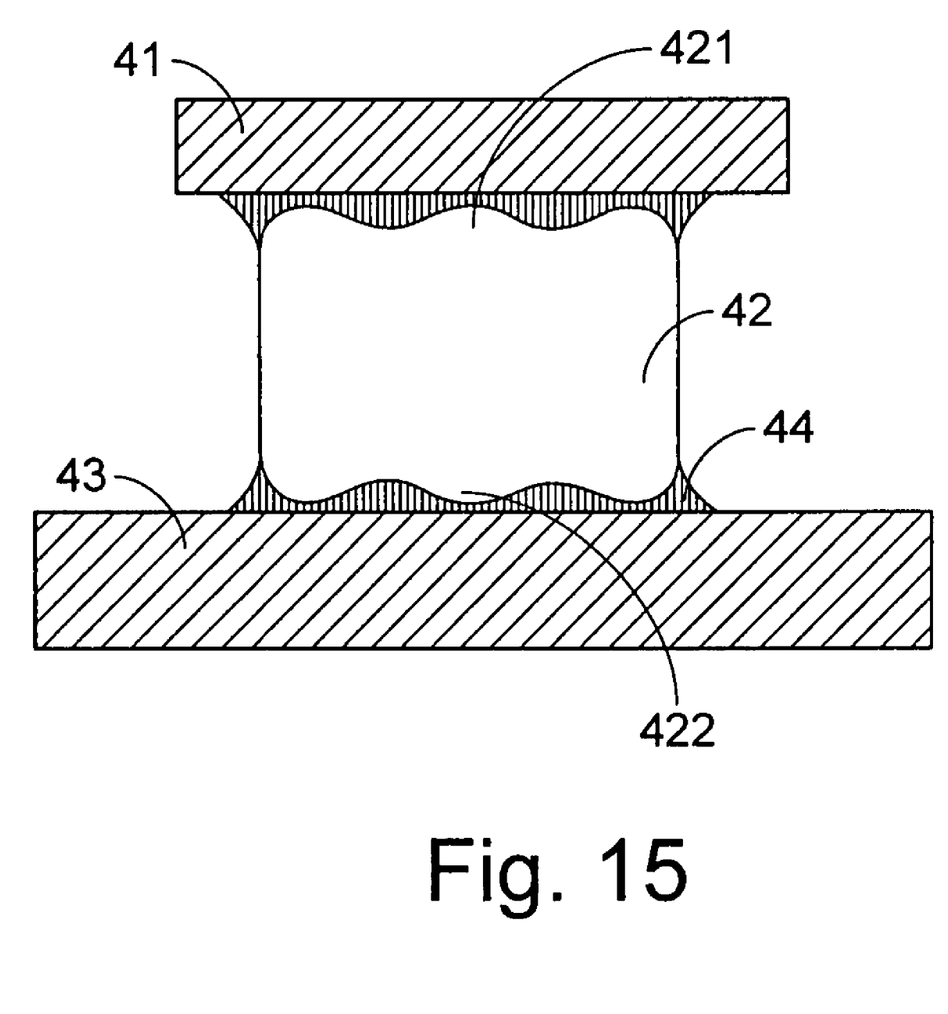
FIG. 15 is a cross-sectional view illustrating two circuit boards interconnected by the surface mount connector of FIG. 13.

Then, as shown in FIG. 15, a solder paste 44 is applied to the contact on the second circuit board 43. In a case that the second conducting part 422 is a wave surface, after the first circuit board 41 and the second circuit board 43 pass through a reflow furnace (not shown), the solder paste 44 will be naturally filled in a gap between the second conducting part 422 and the contact on the second circuit board 43 due to a siphonal effect resulted from the tension force of the molten solder paste 44. In other words, the wave surface of the second conducting part 422 is advantageous for minimizing formation of holes during the soldering period, and thus the second conducting part 422 of the surface mount connector 42 is firmly bonded on the second circuit board 42.

The surface mount connector of the present invention is suitable to interconnect two circuit boards, thereby forming a circuit board assembly. Such a circuit board assembly can be applied to the electronic devices such as a power supply apparatus, a motor controller, etc. Since the power supply apparatus, the motor controller or the like needs a controlling portion and a power supply portion, the controlling portion and the power supply portion can be separately disposed on the first circuit board and the second circuit board, and electrically connected to each other via the surface mount connector of the present invention. In some embodiments of the present invention, the first circuit board has thereon a DC-to-DC converter, and the first circuit board and the second circuit board are in parallel with each other.

From the above description, the connector and the circuit board assembly provided by the present invention can effectively overcome the problems occurred in the prior art. Since the second conducting part of the surface mount connector is in a curvy or wavy shape, the second conducting part is connected to the second circuit board in a point-to-surface manner, instead of surface-to-surface manner. Therefore, the coplanar pins as used in the prior art are no longer essential. In addition, the molten solder paste will be naturally filled in a gap between the curvy raised portion of the second conducting part and the second circuit board due to a siphonal effect resulted from the tension force of the molten solder paste, thereby avoiding a cold soldering effect. In other words, the formation of holes during the soldering period is minimized, and thus impedance and power loss of the surface mount connector are reduced. Furthermore, the rod structure of the surface mount connector facilitates standing more current. The surface mount connectors of the present invention are manufactured by using a common machine having the cutting and punching functions, in replace of using the complex procedures to bend twice. The surface mount connectors of the present invention can be manufactured by automatically feeding the stock material in roll and mounted on the circuit boards. In such a manner, the surface mount connectors of the present invention are manufactured more easily and more precisely.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A circuit board assembly comprising:
   a first circuit board having at least a first contact;
   a second circuit board having at least a second contact; and
   at least one surface mount connector connecting said first circuit board and said second circuit board, said surface mount connector being substantially a solid rod and comprising:
   a first conducting part coupled to said first contact of said first circuit board;
   a second conducting part having a curvy raised surface at a top end thereof, said curvy raised surface being surface-mounted to said second contact of said second circuit board in point-to-surface manner, and the gap between said curvy raised surface and said second contact of said second circuit board being filled by utilizing the siphonal effect from the tension of a molten solder paste; and
   a shoulder portion formed at interface between said first conducting part and said second conducting part, said first circuit board is supported by said shoulder portion.

2. The circuit board assembly according to claim 1 wherein the cross section of said surface mount connector is in a circular or polygonal shape.

3. The circuit board assembly according to claim 1 wherein said first contact is a conducting cavity, and said first conducting part is inserted into said conducting cavity.

4. The circuit board assembly according to claim 3 wherein the diameter of said first conducting part is less than that of said second conducting part.

5. The circuit board assembly according to claim 4 wherein said second conducting part comprises a first sub-part coupled to said first conducting part and a second sub-part coupled to said second circuit board.

6. The circuit board assembly according to claim 5 wherein the diameter of said first sub-part is larger than that of said first conducting part.

7. A surface mount connector for electrically and/or structurally interconnecting first and second circuit boards, said surface mount connector being substantially a solid rod, and comprising:
   a first conducting part having at least a curvy surface and surface-mounted to said first circuit board in point-to-surface manner, the gap between said curvy surface and said first circuit board being filled by utilizing the siphonal effect from the tension of a molten solder paste; and
   a second conducting part having a curvy raised surface at a top end thereof and surface-mounted to said second circuit board in point-to-surface manner with said curvy raised surface of said second conducting part, the gap between said curvy raised surface and said second circuit board being filled by utilizing the siphonal effect from the tension of said molten solder paste.

8. The surface mount connector according to claim 7 wherein the cross section of said surface mount connector is in a circular or polygonal shape.

9. The surface mount connector according to claim 7 wherein the cross section of said surface mount connector is in a rectangular shape.

10. The surface mount connector according to claim 9 wherein said first conducting part and said second conducting part are disposed at opposite sides of said surface mount connector.

11. The surface mount connector according to claim 10 wherein said first conducting part is a wavy surface composed of consecutive plural said curvy surfaces.

12. The surface mount connector according to claim 10 wherein said curvy raised surface of said second conducting part is a wavy or curvy surface.

* * * * *